United States Patent
Roberts et al.

(10) Patent No.: US 11,626,576 B2
(45) Date of Patent: Apr. 11, 2023

(54) LAYERED LIGHT-EMITTING STRUCTURE WITH ROUGHENED INTERFACE

(71) Applicant: SHARP KABUSHIKI KAISHA, Sakai (JP)

(72) Inventors: Peter John Roberts, Oxford (GB); David James Montgomery, Bampton (GB)

(73) Assignee: SHARP KABUSHIKI KAISHA, Sakai (JP)

( * ) Notice: Subject to any disclaimer, the term of this patent is extended or adjusted under 35 U.S.C. 154(b) by 149 days.

(21) Appl. No.: 17/347,995

(22) Filed: Jun. 15, 2021

(65) Prior Publication Data

US 2022/0399526 A1 Dec. 15, 2022

(51) Int. Cl.
*H01L 51/52* (2006.01)
*H01L 51/50* (2006.01)

(52) U.S. Cl.
CPC ...... *H01L 51/5268* (2013.01); *H01L 51/5008* (2013.01); *H01L 51/5056* (2013.01); *H01L 51/5072* (2013.01); *H01L 51/5218* (2013.01); *H01L 51/5234* (2013.01); *H01L 2251/533* (2013.01); *H01L 2251/5315* (2013.01); *H01L 2251/5369* (2013.01)

(58) Field of Classification Search
CPC .......... H01L 51/5268; H01L 51/5008
See application file for complete search history.

(56) References Cited

U.S. PATENT DOCUMENTS

| | | | |
|---|---|---|---|
| 6,965,197 B2 | 11/2005 | Tyan et al. | |
| 7,245,065 B2 | 7/2007 | Ghosh et al. | |
| 7,594,839 B2 | 9/2009 | Cok et al. | |
| 7,834,541 B2 | 11/2010 | Cok | |
| 7,957,621 B2 | 6/2011 | Zhang et al. | |
| 9,054,338 B2 | 6/2015 | Heller et al. | |
| 9,065,075 B1 | 6/2015 | Jeon et al. | |
| 9,099,415 B2 | 8/2015 | Park | |
| 9,412,966 B2 | 8/2016 | Zhu et al. | |
| 9,464,351 B2 | 10/2016 | Yoon et al. | |
| 9,690,033 B2 | 6/2017 | Baker et al. | |

(Continued)

FOREIGN PATENT DOCUMENTS

| CN | 106328682 B | 6/2019 |
|---|---|---|
| JP | 2007027042 A | 2/2007 |

(Continued)

*Primary Examiner* — Anthony Ho
(74) *Attorney, Agent, or Firm* — ScienBiziP, P.C.

(57) ABSTRACT

A light-emitting structure includes a substrate, a sub-pixel stack, a cover layer over the sub-pixel stack, and at least one interface between the substrate and the cover layer. The at least one interface has an interface roughness. The sub-pixel stack includes an emissive layer between a first transport layer and a second transport layer, a first electrode layer coupled to the first transport layer, and a second electrode layer coupled to the second transport layer. The sub-pixel stack is over the substrate and configured to emit light including a scattering component caused by the interface roughness and a cavity component separate from the scattering component. A ratio of a luminance of the scattering component to a luminance of the cavity component increases with a viewing angle relative to a display normal. An optical power of the scattering component is a fraction of an optical power of the cavity component.

20 Claims, 9 Drawing Sheets

(56) References Cited

U.S. PATENT DOCUMENTS

| | | | |
|---|---|---|---|
| 9,825,258 | B2 | 11/2017 | Lee et al. |
| 10,144,842 | B2 | 12/2018 | Cooper et al. |
| 2006/0232195 | A1 | 10/2006 | Cok et al. |
| 2009/0015142 | A1 | 1/2009 | Potts et al. |

FOREIGN PATENT DOCUMENTS

| | | |
|---|---|---|
| KR | 1020140074446 A | 6/2014 |
| KR | 1020150128470 A | 11/2015 |
| KR | 101760221 B1 | 7/2017 |
| KR | 102101613 B1 | 4/2020 |
| WO | 2004/084323 A1 | 9/2004 |
| WO | 2014/096785 A1 | 6/2014 |

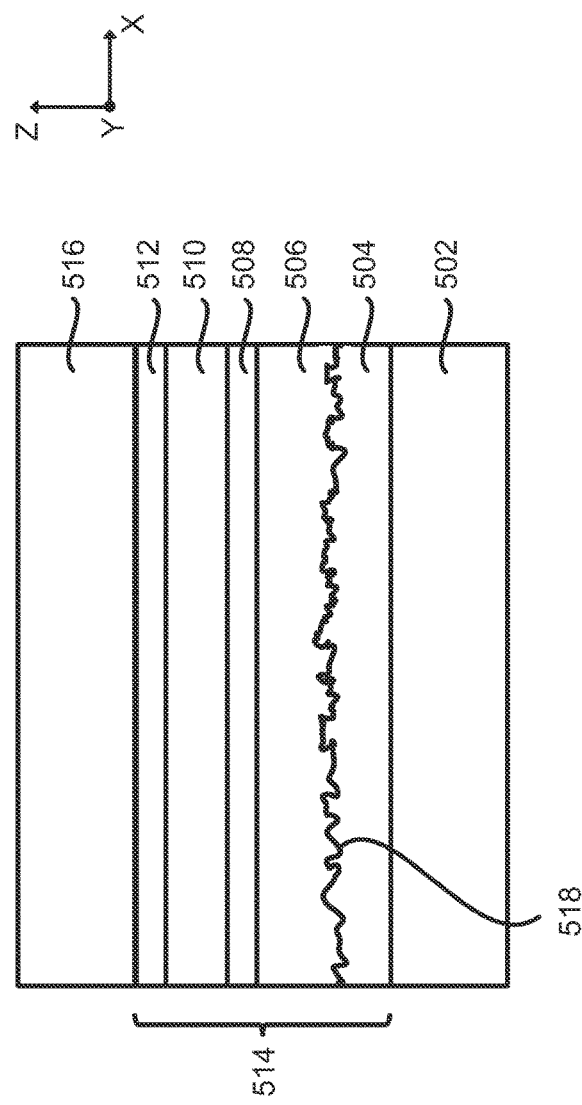
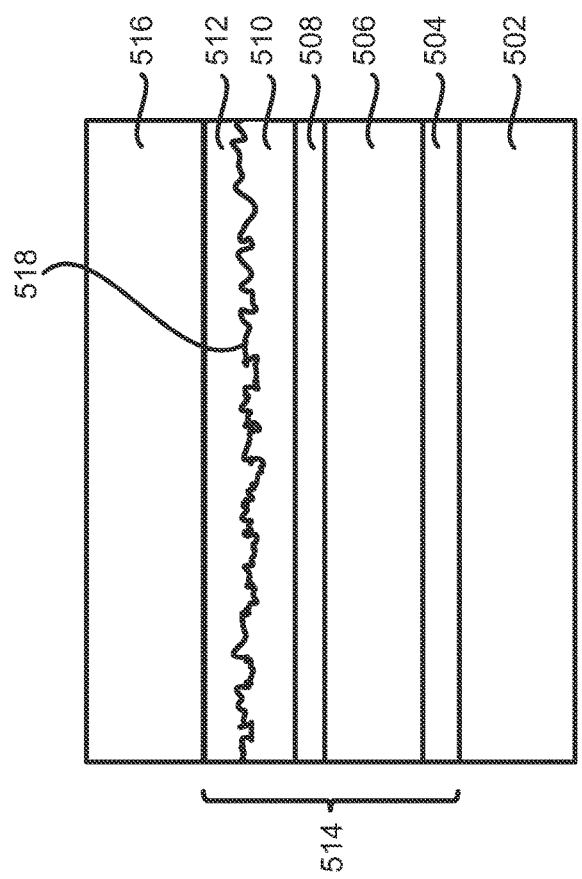

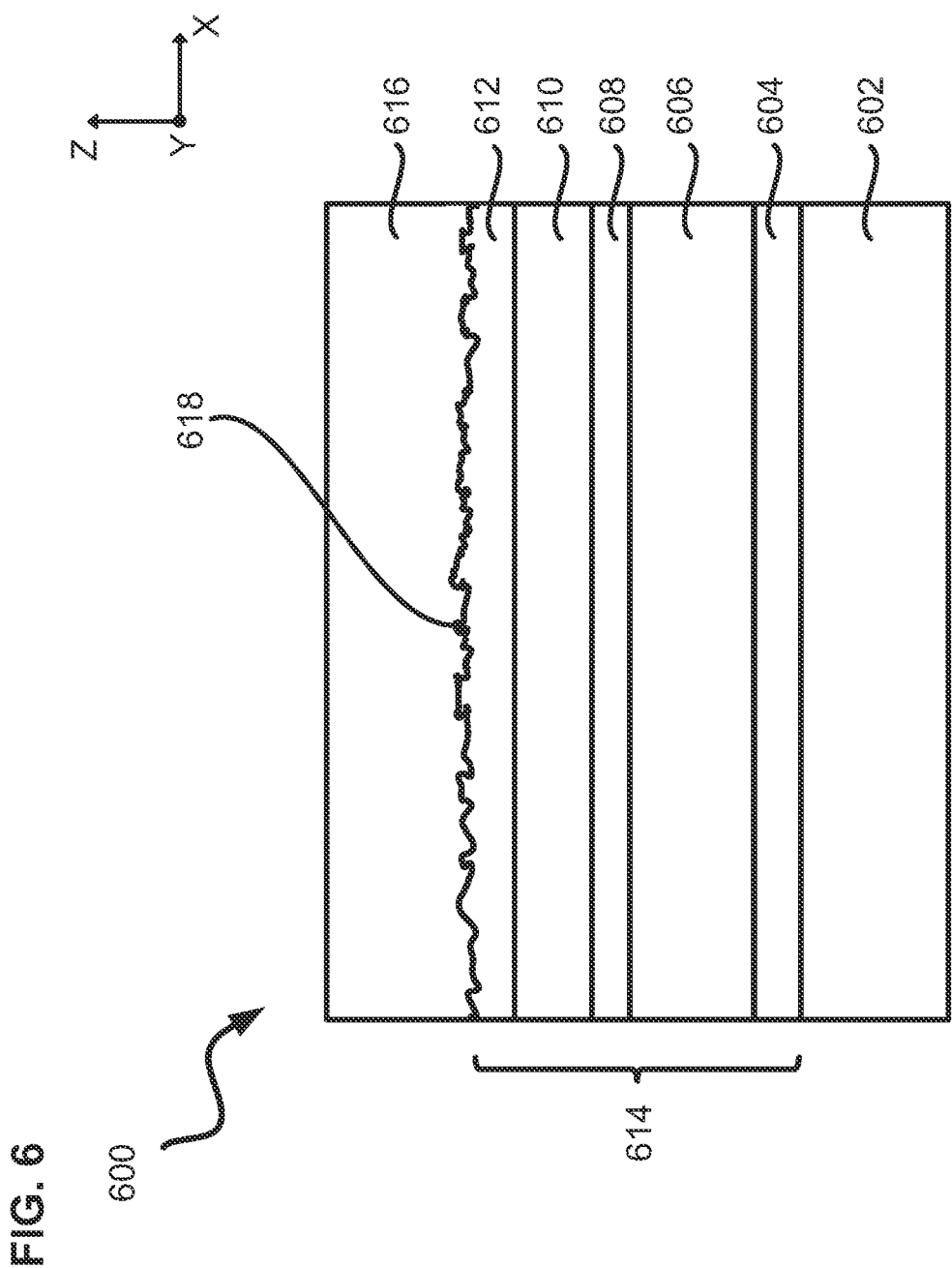

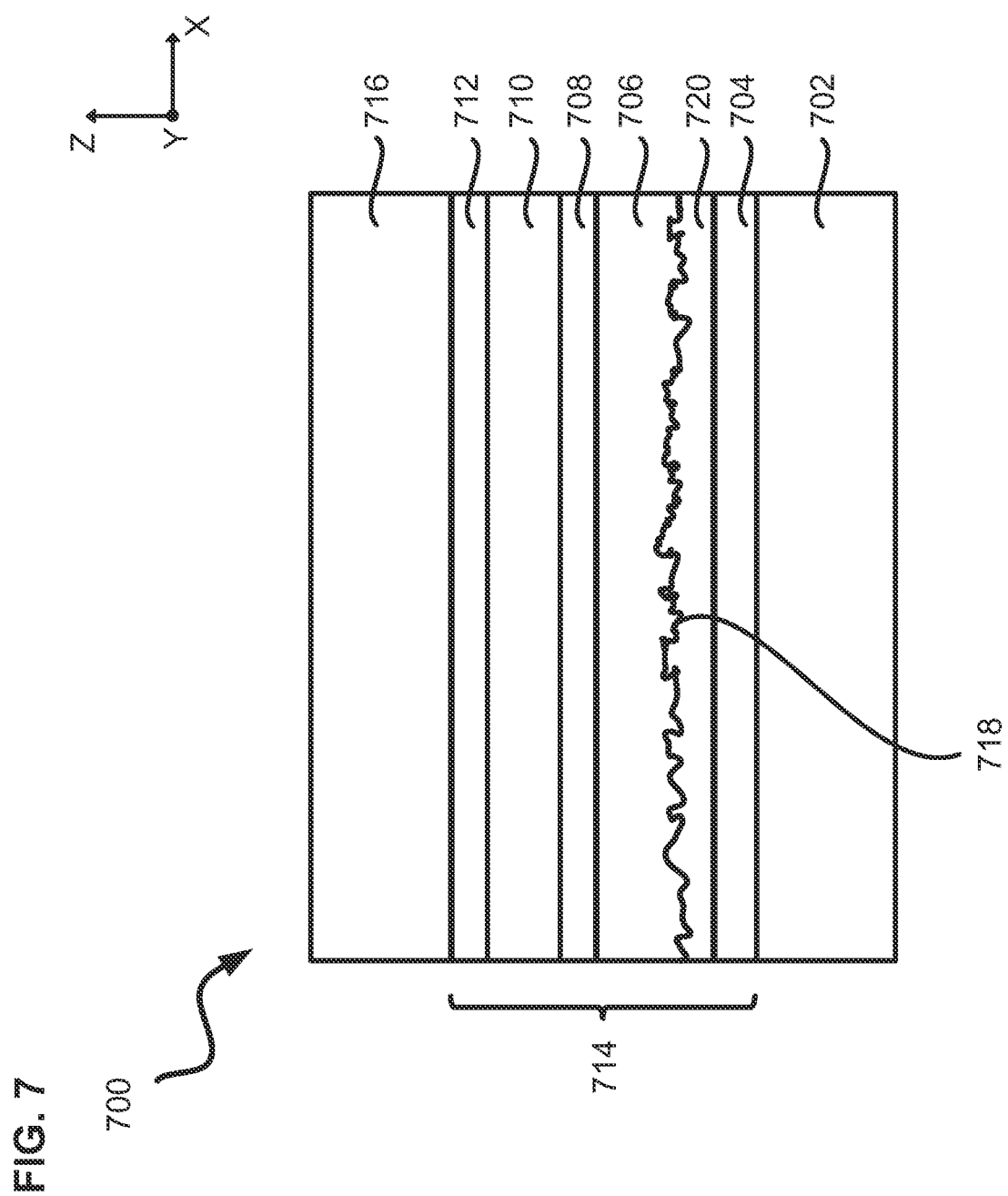

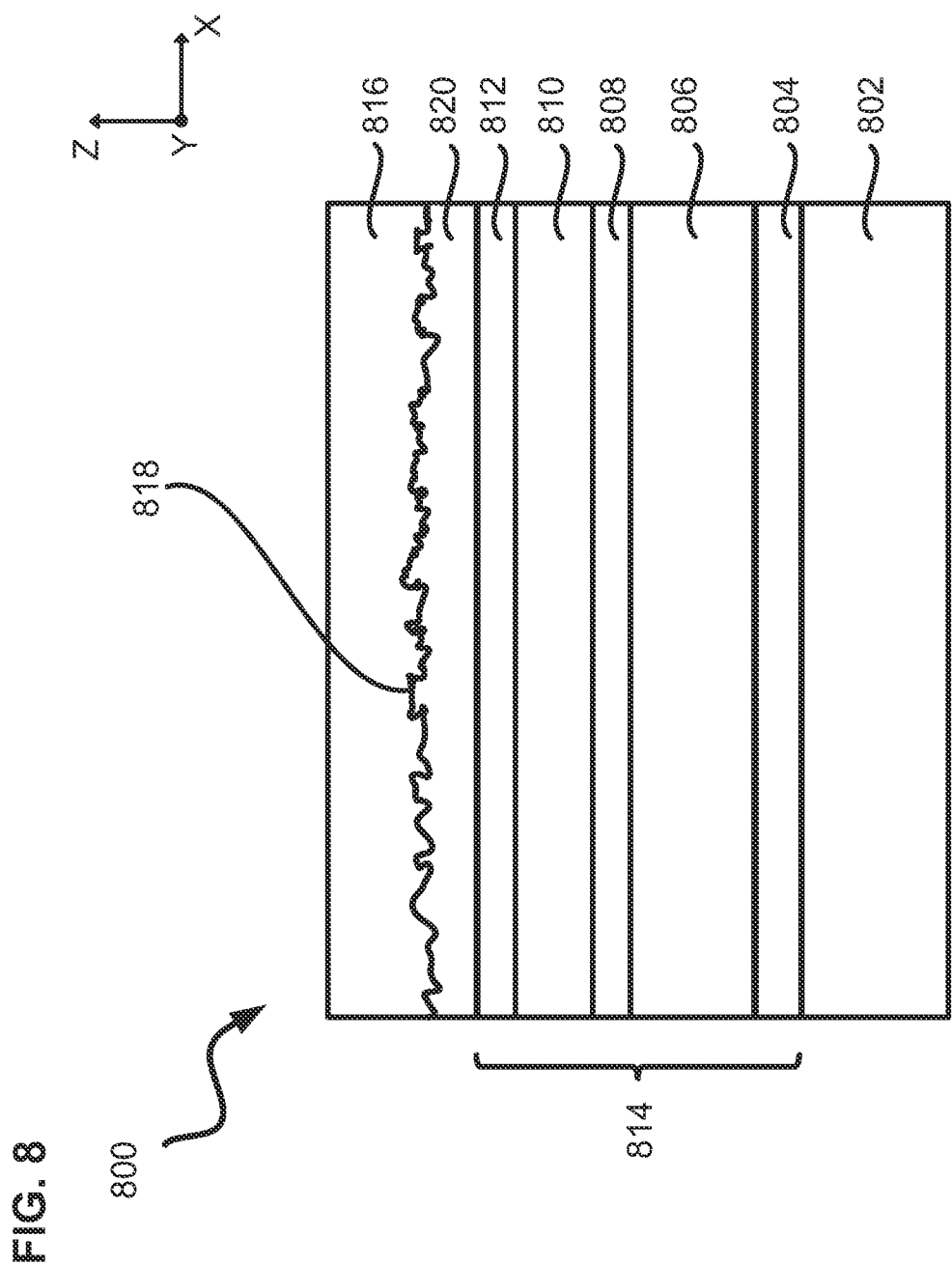

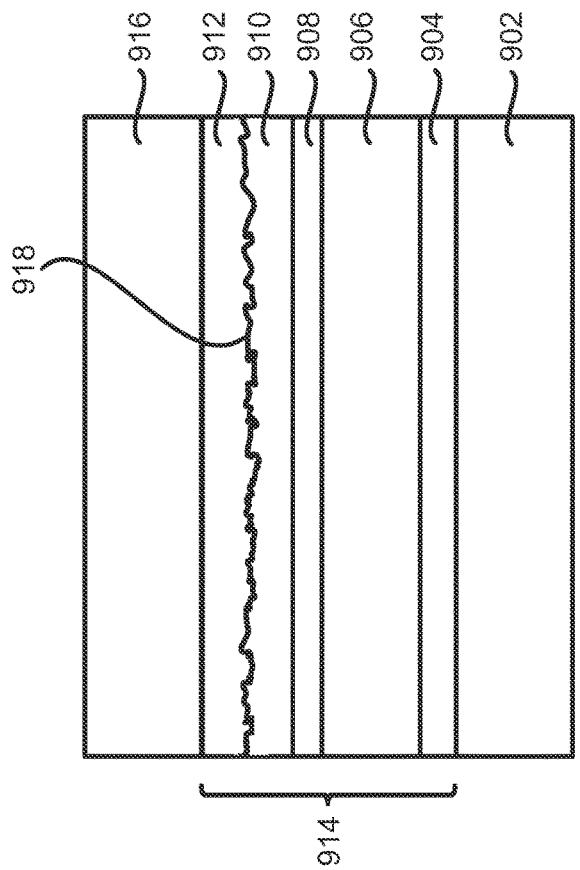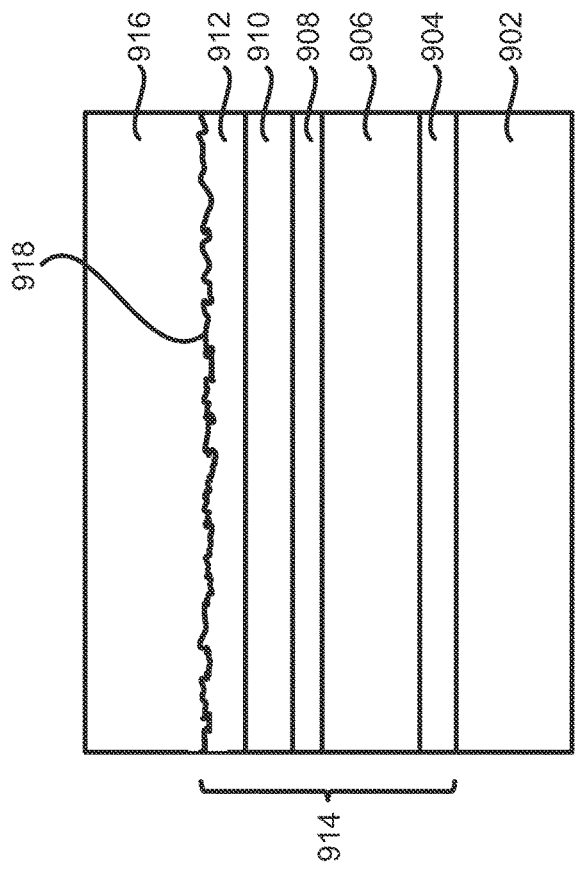

LAYERED LIGHT-EMITTING STRUCTURE WITH ROUGHENED INTERFACE

FIELD

The present disclosure is generally related to layer structures used for emissive display devices such as Organic Light-Emitting Diode (OLED) displays, Quantum dot Light-Emitting Diode (QLED) displays, and the like. In particular, the present disclosure relates to one or more roughened interfaces within a layered light-emitting structure of a pixel.

BACKGROUND

An OLED is among the most prevalent LEDs used in a display device while Quantum Dots (QDs) are proposed as an improvement to OLEDs, as QDs have better spectral emission and are chemically more stable. Quantum dots are often used as phosphors for blue LEDs and exist as backlight for Liquid Crystal Displays (LCDs). Other LED displays may also include micro-LED displays. OLED, QD LED, and micro-LED displays are all displays including a stacked-layer emissive structure.

In a layered emissive structure of a display device, an emissive material (e.g., an organic electroluminescent dye for an OLED and QDs for a QLED) is sandwiched between a hole transporting layer (HTL) and an electron transporting layer (ETL). These three layers are coupled between two conductive layers, e.g., electrodes (anode and cathode), thus, forming a sub-pixel. At least one of the two electrodes is typically made of metal. An electrode located relatively near the "bottom" of the layered emissive structure is (partly or entirely) a thick metal layer such that negligible light may transmit through the "bottom" electrode. The "bottom" electrode may reside on an appropriate substrate (e.g., a cover layer or cover glass). The other one of the two electrodes, a "top" electrode, is located relatively near the "top" of the layered emissive structure to allow at least partial light transmission through the "top" electrode. Such arrangement of a layered emissive structure may be referred to as a "top-emitting" (TE) structure where the "bottom" electrode may include a reflective anode while the "top" electrode may include a transparent cathode. Alternatively, the "bottom" electrode may include a reflective cathode while the "top" electrode may include a transparent anode. In a different arrangement (e.g., a "bottom-emitting" (BE) structure), the "bottom" electrode may be transparent, allowing some light transmission, and the "top" electrode may be reflective, essentially blocking light transmission.

Generally, an emissive layer of the "top-emitting" structure is sandwiched between layer arrangements that provide significant light reflection (e.g., >20%). The emissive layer, along with the HTL and ETL layers, resides within a cavity structure formed by the "top" and "bottom" electrodes, that may allow light leakage. The light reflection generally occurs at an inner surface of the "bottom" electrode. The cavity structure allows narrowing of the wavelength spectrum emitted from the light-emitting structure compared to the natural emission spectrum of an emitting species, which may increase the color gamut range to be displayed. The cavity-related spectral narrowing may be preferred when the emitting species has a large emission bandwidth, such as in an OLED display, or when a very large accessible color gamut range is desired. The cavity structure may also cause perceived colors to change with respect to viewing angles of the light-emitting structure of a display.

Rough or patterned interfaces have been investigated as a mean to increase light extraction efficiency (LEE) of a light-emitting structure having a sub-pixel. One approach that enhances the LEE is strong scattering, which often leads to reduction in the accessible color gamut range. Moreover, strong scattering may likely broaden angular emissions, which may not greatly enhance on-axis brightness (luminance) of a light-emitting structure in a display, and may also introduce considerable inter-pixel cross-talk. Without careful control, strong scattering may exacerbate color shifts with varying angles.

SUMMARY

The present disclosure is directed to a layered light-emitting structure including one or more roughened interfaces.

In accordance with a first aspect of the present disclosure, a light-emitting structure includes a substrate, a sub-pixel stack over the substrate and configured to emit light, a cover layer over the sub-pixel stack, and at least one interface between the substrate and the cover layer. The sub-pixel stack includes an emissive layer between a first transport layer and a second transport layer, a first electrode layer coupled to the first transport layer, and a second electrode layer coupled to the second transport layer. The at least one interface has an interface roughness. The light emitted from the sub-pixel stack includes a scattering component caused by the interface roughness and a cavity component separate from the scattering component. A ratio of a luminance of the scattering component to a luminance of the cavity component increases with a viewing angle relative to a display normal. An optical power of the scattering component is a fraction of an optical power of the cavity component.

In an implementation of the first aspect, the at least one interface is between two adjacent layers of the sub-pixel stack.

In another implementation of the first aspect, the interface roughness has a root mean square roughness between 5 nm and 30 nm over a plurality of spatial frequencies between 0.1 and 10 times the inverse of a central wavelength of light emitted from the sub-pixel stack.

In yet another implementation of the first aspect, the optical power of the scattering component is more than 2% and less than 20% of the optical power of the cavity component.

In yet another implementation of the first aspect, over a viewing angle from 0° to 60°, the ratio of the luminance of the scattering component to the luminance of the cavity component varies by at least a factor of 3.

In yet another implementation of the first aspect, over a viewing angle from 0° to 60°, a color shift of the sub-pixel stack with the at least one interface is reduced by at least a factor of 1.5 in CIE 1976 color space to a color shift of the sub-pixel stack without the at least one interface.

In yet another implementation of the first aspect, over a viewing angle from 0° to 60°, a color shift of a white-point formed from a superposition of light output from two or more sub-pixel stacks with the at least one interface is reduced by at least a factor of 1.5 in CIE 1976 color space compared to a color shift of the white point from the two or more sub-pixel stacks without the at least one interface.

In yet another implementation of the first aspect, the at least one interface is between the first electrode layer and the first transport layer facing the emissive layer, and the first electrode layer is metallic.

In yet another implementation of the first aspect, the at least one interface is between the second electrode layer and the second transport layer facing the emissive layer, and the second electrode layer is metallic.

In yet another implementation of the first aspect, the at least one interface is between the second electrode layer and the cover layer facing away from the emissive layer.

In yet another implementation of the first aspect, the light-emitting structure further includes an intermediate layer between the first electrode layer and the first transport layer. The at least one interface is between the intermediate layer and the first transport layer and faces the emissive layer.

In yet another implementation of the first aspect, the intermediate layer includes a host material and a plurality of nanoparticles made of a transparent conductive material in the host material.

In yet another implementation of the first aspect, a difference between a refractive index of the intermediate layer and a refractive index of the first transport layer is greater than 0.2.

In yet another implementation of the first aspect, the light-emitting structure further includes an intermediate layer between the second electrode layer and the cover layer. The at least one interface is between the intermediate layer and the cover layer and faces away from the emissive layer.

In yet another implementation of the first aspect, the intermediate layer is a dielectric layer or a transparent and conductive layer.

In yet another implementation of the first aspect, a difference between a refractive index of the intermediate layer and a refractive index of the cover layer is greater than 0.2.

In yet another implementation of the first aspect, the at least one interface is between the second electrode layer and the second transport layer facing the emissive layer, and the second electrode layer is non-metallic.

In yet another implementation of the first aspect, the at least one interface is between the second electrode layer and the cover layer facing away from the emissive layer, and the second electrode layer is non-metallic.

In yet another implementation of the first aspect, the first transport layer includes a hole transport layer. The second transport layer includes an electron transport layer. The first electrode layer is an anode layer including a reflector for reflecting the light emitted from the emissive layer. The second electrode layer is a cathode layer including a substantially transparent material.

In yet another implementation of the first aspect, the first transport layer includes an electron transport layer. The second transport layer includes a hole transport layer. The first electrode layer is a cathode layer having a reflector for reflecting the light emitted from the emissive layer. The second electrode layer is an anode layer having a substantially transparent material.

BRIEF DESCRIPTION OF DRAWINGS

Aspects of the example disclosure are best understood from the following detailed description when read with the accompanying figures. Various features are not drawn to scale. Dimensions of various features may be arbitrarily increased or reduced for clarity of discussion.

FIG. 5A is a schematic cross-sectional view of an example light-emitting structure in accordance with an example implementation of the present disclosure.

FIG. 5B is a schematic cross-sectional view of another example light-emitting structure in accordance with an example implementation of the present disclosure.

FIG. 6 is a schematic cross-sectional view of another example light-emitting structure in accordance with an example implementation of the present disclosure.

FIG. 7 is a schematic cross-sectional view of another example light-emitting structure in accordance with an example implementation of the present disclosure.

FIG. 8 is a schematic cross-sectional view of another example light-emitting structure in accordance with an example implementation of the present disclosure.

FIG. 9A is a schematic cross-sectional view of another example light-emitting structure in accordance with an example implementation of the present disclosure.

FIG. 9B is a schematic cross-sectional view of another example light-emitting structure in accordance with an example implementation of the present disclosure.

DESCRIPTION

Figure 1:
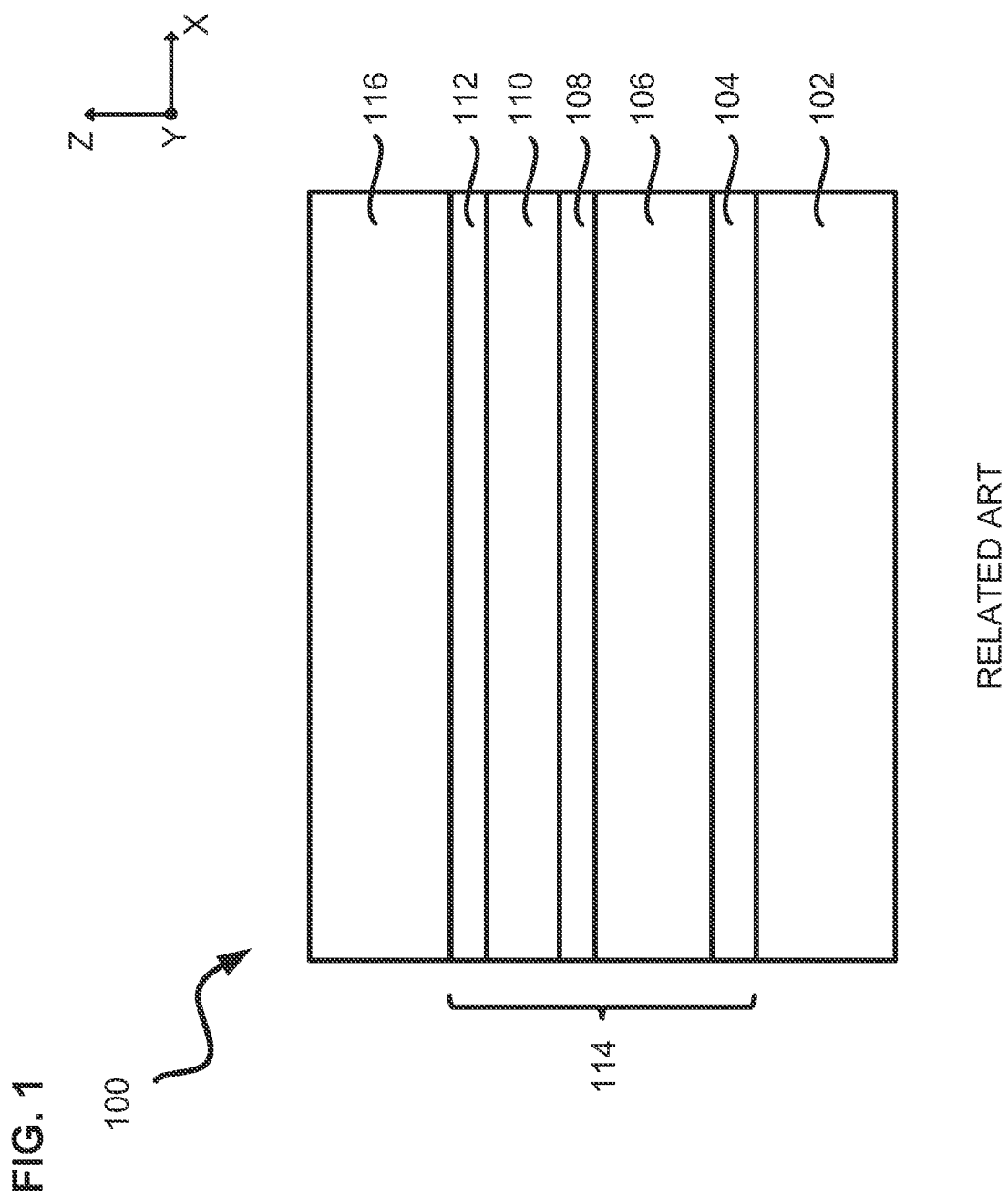
FIG. 1 is a schematic cross-sectional view of a related art sub-pixel stack in a light-emitting structure.

The following disclosure contains specific information pertaining to example implementations in the present disclosure. The drawings in the present disclosure and their accompanying detailed description are directed to merely example implementations. However, the present disclosure is not limited to merely these example implementations. Other variations and implementations of the present disclosure will occur to those skilled in the art.

Unless noted otherwise, like or corresponding elements among the figures may be indicated by like or corresponding reference numerals. Moreover, the drawings and illustrations in the present disclosure are generally not to scale, and are not intended to correspond to actual relative dimensions.

For the purposes of consistency and ease of understanding, like features may be identified (although, in some examples, not shown) by the same numerals in the example figures. However, the features in different implementations may be different in other respects, and thus shall not be narrowly confined to what is shown in the figures.

The description uses the phrases "in one implementation," or "in some implementations," which may each refer to one or more of the same or different implementations. The term "comprising" means "including, but not necessarily limited to" and specifically indicates open-ended inclusion or membership in the so-described combination, group, series and the equivalent. The expression "at least one of A, B and C" or "at least one of the following: A, B and C" means "only A, or only B, or only C, or any combination of A, B and C."

Additionally, for the purposes of explanation and non-limitation, specific details, such as functional entities, techniques, protocols, standards, and the like are set forth for providing an understanding of the described technology. In other examples, detailed description of well-known methods, technologies, systems, architectures, and the like are omitted so as not to obscure the description with unnecessary details.

The present disclosure relates to an emissive display having a light-emitting structure that involves an organic electroluminescent dye for an OLED display or a quantum dot emissive material for a QLED display. Although one or more implementations of the present disclosure may be described with reference to OLEDs, the example implementations provided herein do not limit the scope of the present disclosure and may also be applied in other LEDs or light-emitting structures, such as QLEDs and the like. The LED arrangement for an OLED typically includes a layer of organic electroluminescent dye (e.g., an emissive layer) sandwiched between an electron transport layer (ETL) and a hole transport layer (HTL). The three layers are sandwiched between two conductive layers (e.g., electrodes, anode and cathode) to form a sub-pixel stack. In one or more implementations of the present disclosure, a TE structure for a display device may be applicable. The TE structure involves light emission from a side of the TE structure opposite a substrate (e.g., glass, etc.) on which the TE structure is disposed.

In one or more implementations of the present disclosure, fabrication of a TE display device involves one layer of conductive reflective material, typically made of a metal (e.g., silver or aluminium), deposited on the substrate with the HTL layer on the conductive reflective layer (e.g., a reflective conductor or reflective electrode), the emissive layer on the HTL layer, the ETL layer on the emissive layer, and a transparent electrode layer on the ETL layer. In one implementation, the reflective electrode may have a thickness greater than 50 nm. In another example implementation, the reflective electrode may include a layer of silver having a thickness of approximately 100 nm and a layer of Indium Tin Oxide (ITO) having a thickness of approximately 10 nm. In one example implementation, the HTL layer may include a layer of PEDOT:PSS (poly(3,4-ethylenedioxythiophene) polystyrene sulfonate) approximately 40 nm thick and a layer of TFB (poly(9,9'-dioctylfluorene-co-bis-N,N'-(4-butylphenyl)diphenylamine)) having a thickness of approximately 35-45 nm on the PEDOT:PSS layer. The thicknesses of the HTL layers may vary depending on the color of the sub-pixels. An approximately 20 nm thick emissive layer (containing organic dye for an OLED, or semiconductor quantum wells or quantum dot emitters for a QLED) may be disposed on the HTL layer and the ETL layer may be disposed on the emissive layer. The ETL layer may include an organic material or an inorganic material, such as Zinc Oxide (ZnO) nanoparticles. The ETL layer may have a thickness of approximately 30-80 nm. In one example implementation, the transparent electrode layer (e.g., a top electrode layer of the TE display device) may include a thin metal layer that is thick enough to carry sufficient current, yet thin enough to be at least partially transparent to light and disposed on the ETL layer. In one implementation, the transparent electrode layer may include silver nanowires having a thickness of about 10-15 nm. In another example implementation, the transparent electrode layer may include a Magnesium-Silver alloy.

The present disclosure is not limited to the examples provided herein, as the essential principle of the disclosed structure still applies if the arrangement of the ETL and HTL layers is reversed. In one implementation of the present disclosure, the transport layer is thinner than the transport layer disposed closer to the substrate regardless of whether the ETL layer or the HTL layer is disposed on the emitting side of the emissive layer away from the substrate. The thicknesses and materials of the layers of the TE display device as discussed above are not limited to the example values provided herein. The light-emitting or light emissive structure in the present disclosure may use certain terminologies pertaining to only OLED displays or QLED displays. However, it is to be understood that the applicability of the subject matter of the present disclosure can be extended to other types of light-emitting displays.

The light-emitting structure of the present disclosure may be particularly beneficial to light-emitting displays in which the emissive layer is sandwiched between layer arrangements that provide significant light reflection (e.g., >20%). The light-emitting structure of the present disclosure may provide weak scattering correction by introducing roughness to an interface between two layers of the light-emitting structure to reduce the angular color-shift in a controlled manner.

In one or more implementations of the present disclosure, light emissions from the emissive layer may propagate through other layers of the light-emitting structure. By introducing roughness to an interface between two layers of the light-emitting structure of the present disclosure, the light emissions that propagate through the layers of the light-emitting structure may have a scattering component in addition to a cavity component. The cavity component may be light emissions that propagate through a cavity structure formed by two electrodes of the light-emitting structure and encounter multiple interferences within the substantially planar light-emitting structure. The scattering component may be light emissions propagating through relatively small amplitude interface roughness between two layers of the light-emitting structure. The cavity component may have spectral and angular properties similar to that for light emissions from a light-emitting structure having substantially no interface roughness.

In one or more implementations of the present disclosure, the interface roughness may reside between two layers of a light-emitting structure, which may cause the scattered component to be substantially wavelength shifted from the cavity component. As such, a weak scattered component may cancel the angular color shift of the cavity component. To achieve such cancellation, appropriate control may be imposed over angular properties (e.g., luminance, etc.) of the scattered component that escapes from the display. Luminance of the scattered component may have a dependence on a viewing angle θ to a normal to the display that is significantly different from the dependence on the same viewing angle θ of the cavity component. Ideally, the scattered component luminance does not decrease significantly with increasing angle, and the scattered luminance does not decrease with increasing angle θ as rapidly as the luminance of the cavity component. The scattered luminance may increase with angle θ to reach a maximum luminance at a particular viewing angle $θ_{max}$. The scattered luminance angular variation may depend on the color, the color-shift, and the luminance properties of the cavity component, as well as the color and color-shift properties of the scattered component. The cavity component properties may be determined by measurement, or by interface transfer matrix simulation if the layers' thicknesses, layers' refractive indices, and emitter natural emission spectra are known. In one implementation, an example simulation method for rough interface scattering may be the Rayleigh-Fourier method, the small-slope approximation of Voronovich, and the tangent-plane approximation, but are not limited to the example simulation methods provided herein. The scattered component properties are determined by the layers' materials and thicknesses, the emitter natural emission spectra, and the roughness power spectrum characterising a roughened interface between two layers of the light-emitting structure. The interface roughness may be formed between two layers of the light-emitting structure, for example, by lithography, nano-imprinting, or embossing on a surface of one of the two layers.

The example implementations of the present disclosure may be described in terms of an OLED display structure or a QLED display structure. However, the present disclosure is not limited only to OLED and QLED display structures and may be applicable to various implementations related to other LED display structures.

FIG. 1 is a schematic cross-sectional view of a related art sub-pixel stack in a light-emitting structure. In FIG. 1, a light-emitting structure 100 may include a substrate 102, a related art sub-pixel stack 114 over the substrate 102, and a cover 116 over the related art sub-pixel stack 114. The related art sub-pixel stack 114 may include an emissive material 108 between a hole transport layer 106 and an electron transport layer 110, a bottom electrode 104 (e.g., reflective anode) coupled to the hole transport layer 106 and a top electrode 112 (e.g., transparent cathode) coupled to the electron transport layer 110. The related art sub-pixel stack 114 in a light-emitting structure 100 of an OLED display, for example, may be similar in structure as a TE structure as previously discussed, thus, details of the TE structure are omitted for brevity.

Figures 2A, 2B:
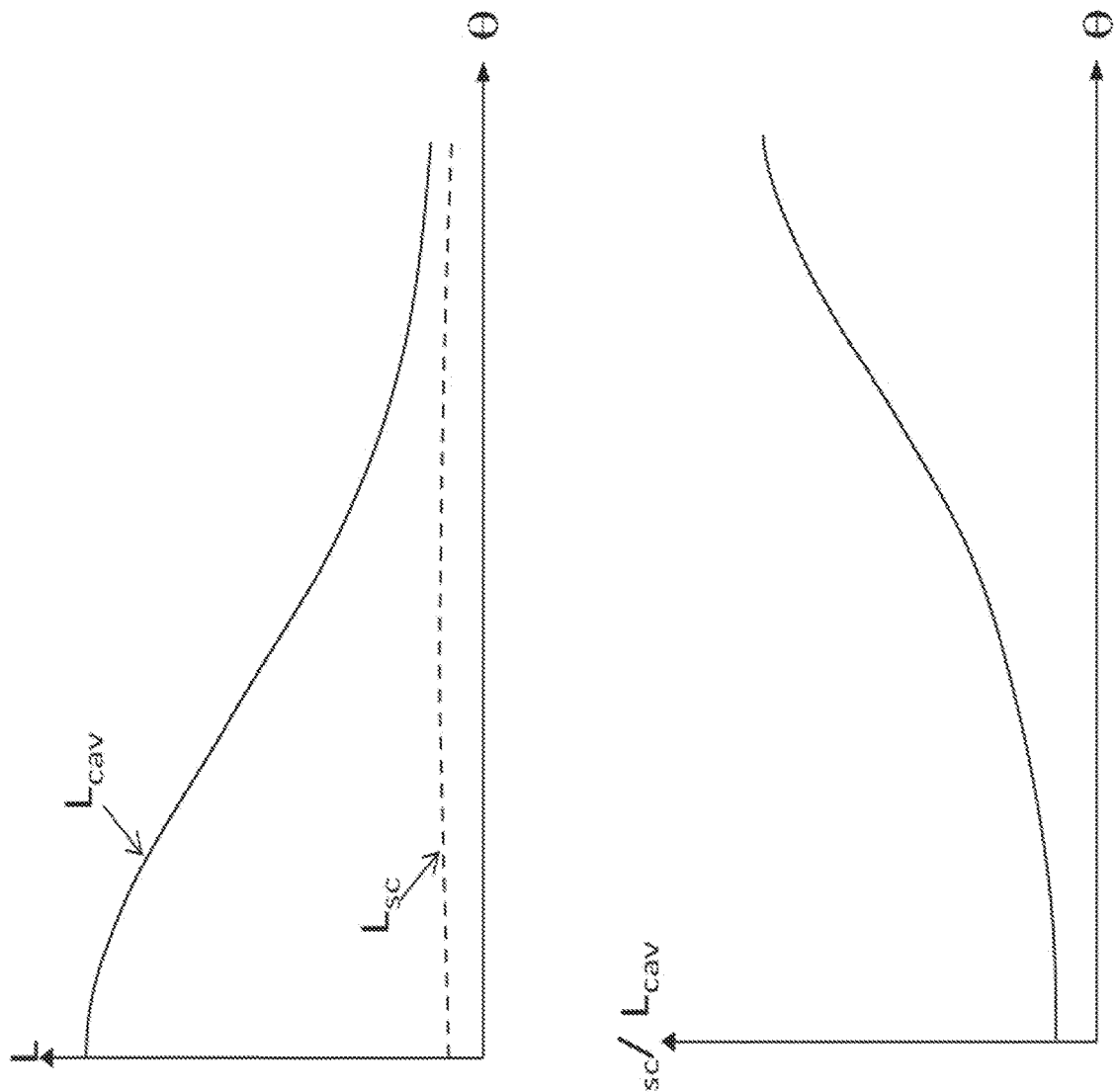
FIG. 2A is a schematic diagram illustrating example luminance distributions of light emission components from a sub-pixel stack of an example light-emitting structure in accordance with an example implementation of the present disclosure.
FIG. 2B is a schematic diagram illustrating example luminance ratios of the example luminance distributions in FIG. 2A in accordance with an example implementation of the present disclosure.

FIG. 2A is a schematic diagram illustrating example luminance distributions of light emission components from a sub-pixel stack of an example light-emitting structure in accordance with an example implementation of the present disclosure. FIG. 2B is a schematic diagram illustrating example luminance ratios of the example luminance distributions in FIG. 2A in accordance with an example implementation of the present disclosure.

In FIG. 2A, the schematic diagram illustrates example luminance distributions 200A of light emission components from a sub-pixel stack of an example light-emitting structure into air with respective to various viewing angles θ. In one or more implementations of the present disclosure, the light emissions from the sub-pixel stack of the example light-emitting structure may include a scattering (e.g., weak) component having luminance $L_{sc}$ and a cavity component having luminance $L_{cav}$. In FIG. 2A, the scattered component luminance $L_{sc}$ may not decrease significantly with increasing viewing angle θ and the scattered component luminance $L_{sc}$ may not decrease with increasing viewing angle θ as rapidly as the cavity component luminance $L_{cav}$. An overall luminance L distribution of the light emissions from the sub-pixel stack of the example light-emitting structure may include the scattering luminance $L_{sc}$ and the cavity luminance $L_{cav}$. In one or more implementations of the present disclosure, the scattering luminance $L_{sc}$ may contribute to the overall luminance L distribution when roughness is introduced to an interface between two layers of the light-emitting structure. The cavity luminance $L_{cav}$ may be the luminance of the light emissions emitted from the sub-pixel stack of the light-emitting structure that may be influenced by interferences within the layered light-emitting structure without any interface roughness. The scattering luminance $L_{sc}$ is considerable weaker (e.g., lower in optical power) than the cavity luminance $L_{cav}$. The layers of the sub-pixel stack of the light-emitting structure may have predetermined thicknesses such that the cavity luminance $L_{cav}$ peak towards a forward direction (e.g., a direction towards a viewer of the light emitting structure) to improve on-axis brightness. The interface roughness may include roughness properties that are predetermined such that the scattering luminance $L_{sc}$ appear to have a relatively weaker dependence on the viewing angle θ.

In FIG. 2B, the schematic diagram illustrates example luminance ratios $L_{sc}/L_{cav}$ of the example luminance ($L_{sc}$ and $L_{cav}$) distributions in FIG. 2A with respective to various viewing angles θ. In one or more implementations of the present disclosure, the example luminance ratio $L_{sc}/L_{cav}$ between the example luminance ($L_{sc}$ and $L_{cav}$) may increase with respect to increasing viewing angle θ. In one or more implementations, the luminance ratio $L_{sc}/L_{cav}$ of the scattering luminance $L_{sc}$ to the cavity luminance $L_{cav}$ varies by, at least, a factor of 3 over a viewing angle from 0° to 60°.

Figure 3B:
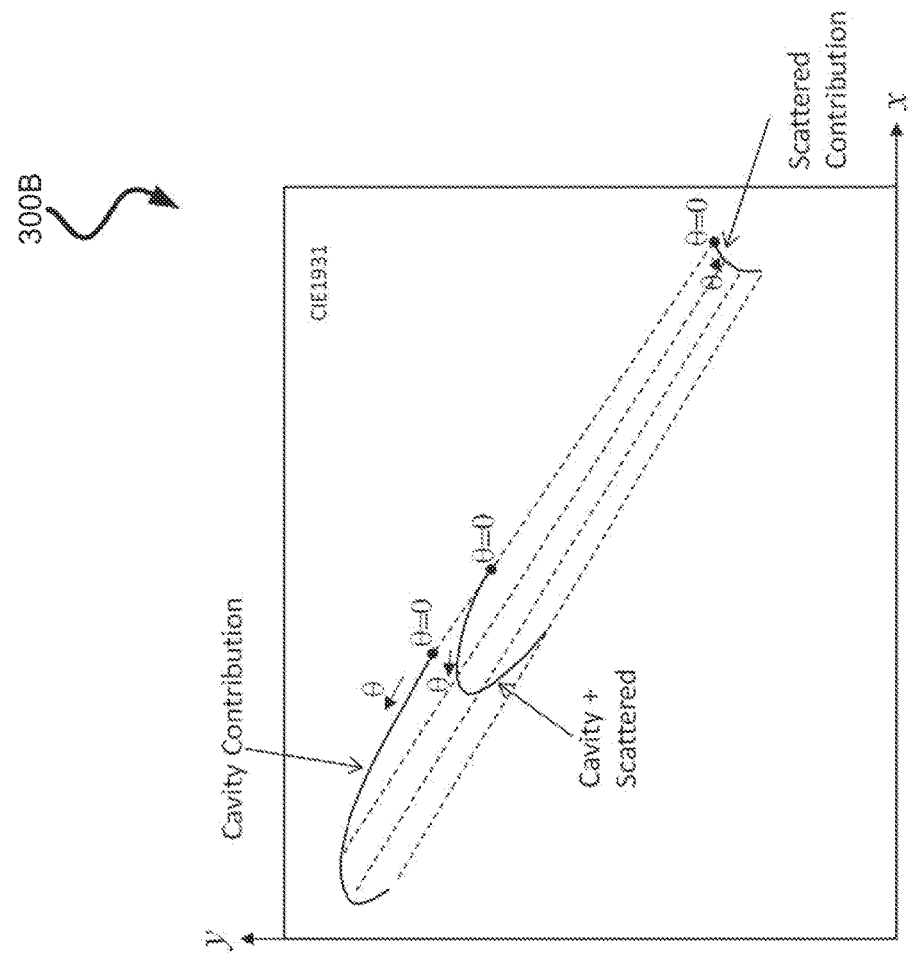
FIG. 3B is a schematic diagram illustrating exemplary color trajectories in a CIE 1931 color space for a green sub-pixel in an example light-emitting structure in accordance with an example implementation of the present disclosure.
Figure 3A:
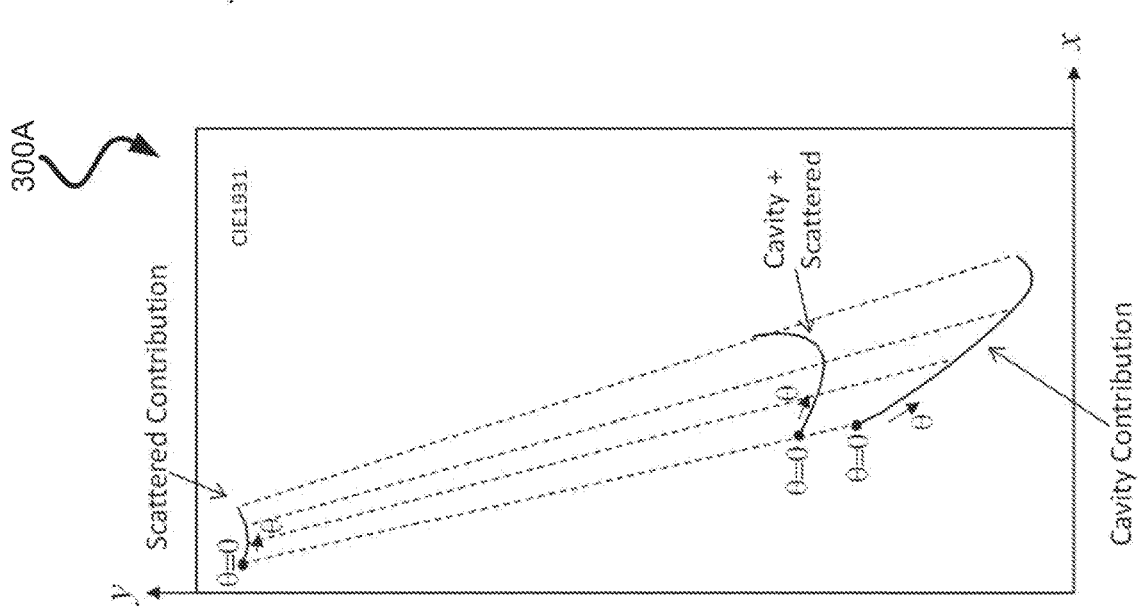
FIG. 3A is a schematic diagram illustrating exemplary color trajectories in a CIE 1931 color space for a blue sub-pixel in an example light-emitting structure in accordance with an example implementation of the present disclosure.

FIG. 3A is a schematic diagram illustrating exemplary color trajectories in a Commission Internationale de l'éclairage (CIE) 1931 color space for a blue color sub-pixel in an example light-emitting structure in accordance with an example implementation of the present disclosure. FIG. 3B is a schematic diagram illustrating exemplary color trajectories in a CIE 1931 color space for a green sub-pixel in an example light-emitting structure in accordance with an example implementation of the present disclosure.

Light emissions from a light-emitting structure having multiple stacked layers, such as that in an OLED display or a QLED display, include a cavity component that cause color shifts. Color shifts may still occur in the light emission emitted from an optimized light-emitting structure, e.g., a perfectly planar cavity light-emitting structure with smooth interfaces between all layers. Negligible scattering may also occur due to inhomogeneities within the layers of the perfect planar light-emitting structure. Introducing a weak scattering component, by providing roughness to an interface between two layers of the example light-emitting structure, in addition to the cavity component may substantially cancel the color shift of the cavity component, thus reducing the overall color shifts from the light-emitting structure.

In FIG. 3A, color trajectories 300A of light emission components in a CIE 1931 color space for a blue color sub-pixel with respect to various viewing angles θ are expressed. In one or more implementations of the present disclosure, as the viewing angle θ changes, the blue-like color changes as well. In the example light-emitting structure, the cavity component alone, represented by a "Cavity Contribution" trajectory in FIG. 3A, for the blue color emissions undergoes a particular amount of color shift as the viewing angle θ increases. With an interface roughness between two layers of the light-emitting structure, the scattered component alone, represented by a "Scattered Contribution" trajectory in FIG. 3A, is color-detuned from the cavity component. The scattering contribution may experience relatively less color shift than that of the cavity contribution as the viewing angle θ increases. In a light-emitting structure with the interface roughness, the cavity contribution and the scattered contribution result in a combined "Cavity+Scattered" trajectory in FIG. 3A, which appears to have a milder color shift compared to the cavity contribution alone.

Similar to FIG. 3A, FIG. 3B illustrates color trajectories 300B of light emission components in a CIE 1931 color space for a green color pixel with respect to various viewing angles θ. In one or more implementations of the present disclosure, as the viewing angle θ changes, the green-like color changes as well. In the example light-emitting structure, the cavity component alone, represented by a "Cavity Contribution" trajectory in FIG. 3B, for the green color emissions experiences a particular color shift as the viewing angle θ increases. With roughness introduced to an interface between two layers of the light-emitting structure, the scattered component alone, represented by a "Scattered Contribution" trajectory in FIG. 3B, is color-detuned from the cavity component. The scattering contribution may experience less color shift than that of the cavity contribution as the viewing angle θ increases. In a light-emitting structure with the interface roughness, the cavity contribution and the scattered contribution result in a combined "Cavity+Scattered" trajectory in FIG. 3B, which appears to have a milder color shift as opposed to the cavity contribution alone.

As discussed above, the color of a scattered contribution (or component) due to the interface roughness may be separated in color from the cavity contribution (or component). The color de-tuning may be particularly significant for roughness at a layer interface within the cavity formed by the two electrodes of a sub-pixel stack. The color of the scattered contribution may also generally change with viewing angle θ. However, the angular color shift of the scattered contribution may be significantly less than that of the cavity contribution, as discussed with respect to FIGS. 3A and 3B. At a particular viewing angle θ, the color coordinates resulting from the cavity and scattered contributions combined may fall on a line that joins the color coordinates of the cavity and scattered contributions at such particular viewing angle. The higher the luminance ratio $L_{sc}/L_{cav}$, the more the resulting color coordinate moves towards the scattered light color. By tailoring the roughness properties at the interface roughness to provide a luminance ratio $L_{sc}/L_{cav}$ variation similar to that in FIG. 2B, the angular color-shift may be reduced via the combined contribution (e.g., the scattered and cavity contributions).

Figure 4:
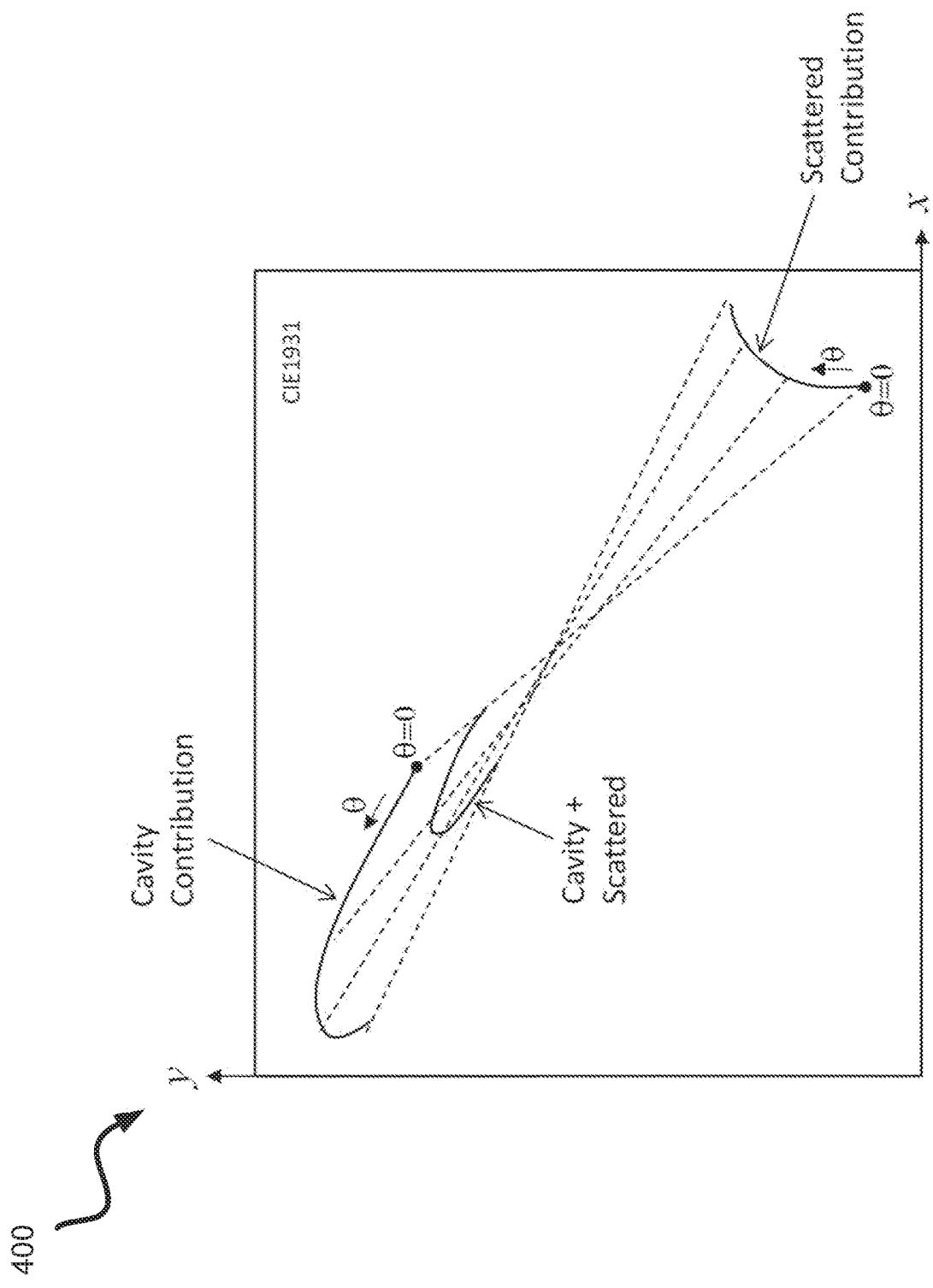
FIG. 4 is a schematic diagram illustrating exemplary color trajectories in a CIE 1931 color space for another green sub-pixel in an example light-emitting structure in accordance with an example implementation of the present disclosure.

FIG. 4 is a schematic diagram illustrating exemplary color trajectories in a CIE 1931 color space for another green sub-pixel in an example light-emitting structure in accordance with an example implementation of the present disclosure.

The exemplary color trajectories in FIG. 3B may be substantially the same as that in FIG. 4, thus details of the color trajectories are omitted for brevity. In one or more implementations of the present disclosure, such as in FIG. 4, the color-shift trajectory of a scattering component (represented by "Scattered Contribution") may be directed very differently within the color space from color-shift trajectory of a cavity component (represented by "Cavity Contribution"), which may provide better cancellation of the color shift due to the combined output for the scattering and cavity components (represented by "Cavity+Scattered"). The resulting color-shift trajectory of the combined scattering and cavity components (represented by "Cavity+Scattered") may be relatively less than the color-shift trajectory of either the scattering component or the cavity component, taken individually. The color-shift trajectory of the scattered component may be controlled by the nature of the roughness of the scattering layer interface or interfaces (e.g., interface roughness(es) between two layers of a light-emitting structure). The roughness may be described by a roughness spectrum $S(k_{sp})$ expressed as a function of the spatial frequency $k_{sp}$. For a given layered light-emitting structure, the shape of the roughness spectrum over the range of spatial frequencies may be expressed by the following Expression [1]:

$$0.1 < k_{sp}\lambda_c/(2\pi) < 10 \qquad \text{Expression [1]}$$

where $\lambda_c$ is a wavelength characteristic of the light emission (e.g., the peak wavelength). Expression [1] may determine the shape of the scattered color trajectory with viewing angle θ and may affect the location of this color trajectory in a color space. The magnitude of the roughness power spectrum, together with the shape, sets the overall optical power that is scattered by the roughness. In one or more implementations, the interface roughness may have a root mean square (RMS) roughness between 5 nm and 30 nm over the spatial frequencies between 0.1 and 10 times the inverse of a central wavelength of the light emitted from the sub-pixel stack of the example light-emitting structure. In one or more implementations, the optical power of the scattering component may be more than 2% and less than 20% of the optical power of the cavity component. In one or more implementations, a color shift of the sub-pixel stack with the at least one interface may be reduced by at least a factor of 1.5 in a CIE 1976 color space with respect to a color shift of the sub-pixel stack without the at least one interface over a viewing angle from 0° to 60°. In other implementations, a color shift of a white-point formed from a superposition of the output of two or more sub-pixels containing one or more of the sub-pixel stacks, having at least one interface, may be reduced by at least a factor of 1.5 in a CIE 1976 color space with respect to a color shift of the sub pixels without the at least one interface over a viewing angle from 0° to 60°. In one example implementation, the two or more sub-pixels may emit light of different colors (e.g., red, green, or blue color light emissions). With careful control, the roughened interface may be structured to produce a scattered light contribution (or component) that may substantially reduce the sub-pixel angular color shift due to the cavity contribution (or component).

In one or more implementations, the x-axis and y-axis in FIGS. 3A, 3B, and 4 may represent chromaticity coordinates in a CIE 1931 color space.

FIG. 5A is a schematic cross-sectional view of an example light-emitting structure in accordance with an example implementation of the present disclosure. FIG. 5B is a schematic cross-sectional view of another example light-emitting structure in accordance with an example implementation of the present disclosure.

In FIG. 5A, an example light-emitting structure 500A may include a substrate 502, a sub-pixel stack 514 over the substrate 502, and a cover layer or window 516 over the sub-pixel stack 514. The sub-pixel stack 514 may include an emissive layer 508 between a first transport layer 506 (e.g., an HTL layer) and a second transport layer 510 (e.g., an ETL layer), a first electrode layer 504 (e.g., a bottom reflective anode) coupled to the first transport layer 506, and a second electrode layer 512 (e.g., a top transparent cathode) coupled to the second transport layer 510. The example light-emitting structure 500A may be a TE structure in one or more implementations of the present disclosure, but is not limited to the TE structure example provided herein. The arrangement of the first electrode layer 504 and the second electrode layer 512 is not limited to the examples provided herein and may be reversed. For example, the first electrode layer 504 may be a bottom cathode that is a metallic reflector that reflects light emitted from the emissive material 508, and the second electrode layer 512 may be a top anode that is non-metallic and substantially transparent.

In one or more implementations of the present disclosure, the example light-emitting structure 500A may also include an interface 518 with an interface roughness introduced between the first electrode layer 504 and the first transport layer 506 facing towards the emissive layer 508. In other words, the interface 518 with the interface roughness may be inside the cavity of the example light-emitting structure 500A. In one or more implementations, the first electrode layer 504 may be metallic and due to the nature of surface plasmon polariton modes that are centred at the metallic interface 518, the height of the interface roughness of the interface 518 may be low (e.g., less than 5 nm) to provide adequate scattering to significantly reduce color shift. In such an implementation, a roughness power spectrum at the metallic interface may be represented by the following mathematical Expression [2]:

$$(1nm)^2 < 2\pi \int_{0.1(2\pi/\lambda_c)}^{10(2\pi/\lambda_c)} k_{sp} dk_{sp} * S(k_{sp}) < (10nm)^2 \quad \text{Expression [2]}$$

where the roughness may be described by a roughness spectrum $S(k_{sp})$ expressed as a function of the spatial frequency $k_{sp}$, and $\lambda_c$ is a wavelength characteristic of the light emission (e.g. the peak wavelength). For simplicity, the roughness is assumed statistically isotropic and the power spectrum is interpreted as being a 2-dimensional (2D) form.

In some implementations, by introducing a low level of roughness (e.g., low roughness height) at the metallic interface 518, layers of the light-emitting structure 500A adjacent to the interface roughness may not planarize such that other interfaces in the adjacent layers of the light-emitting structure 500A may inherit some degree of roughness from the metallic roughened interface. The combined effect of all the resulting rough interfaces (e.g., inherited and the introduced) may need to be considered.

In FIG. 5B, an example light-emitting structure 500B may be substantially similar in structure with respect to the example light-emitting structure 500A in FIG. 5A, thus details of the light emitting structure 500B are omitted for brevity.

In one or more implementations, the example light-emitting structure 500B in FIG. 5B may differ from the example light-emitting structure 500A in FIG. 5A in that the example light-emitting structure 500B may include an interface 518 with an interface roughness introduced between the second transport layer 510 and the second electrode layer 512 facing towards the emissive layer 508. In other words, the interface 518 with the interface roughness may be inside the cavity of the example light-emitting structure 500B.

In one or more implementations, the example light-emitting structure 500B in FIG. 5B may also differ from the example light-emitting structure 500A in FIG. 5A in that the second electrode layer 512 in the light-emitting structure 500B in FIG. 5B may be metallic and due to the nature of surface plasmon polariton modes that are centred at the metallic interface 518, the height of the interface roughness of the interface 518 may be low (e.g., less than 5 nm) to provide adequate scattering to significantly reduce color shift. In such implementation, the roughness power spectrum at the metallic interface may be presented by the aforementioned mathematical Expression [2]. For simplicity, the roughness has been assumed statistically isotropic and the power spectrum interpreted as being of a 2-dimensional (2D) form.

In some implementations, by introducing a low level of roughness (e.g., low roughness height) at the metallic interface 518, layers of the light-emitting structure 500A adjacent to the interface roughness may not planarize such that other interfaces in the adjacent layers of the light-emitting structure 500A may inherit some degree of roughness from the metallic roughened interface. The combined effect of all the resulting rough interfaces (e.g., inherited and the introduced) may need to be considered.

In one or more implementations of the present disclosure, with a predetermined low level of roughness introduced to the interface 518 in the light-emitting structures 500A and 500B, a weak scattering component (e.g., weaker optical power relatively to that of the cavity component) may be provided in addition to the cavity component due to the cavity within the light-emitting structures 500A and 500B. With the weak scattering component, a ratio of a luminance of the scattering component to a luminance of the cavity component may increase with a viewing angle relative to a display normal of a display. See FIGS. 2A and 2B above.

FIG. 6 is a schematic cross-sectional view of another example light-emitting structure in accordance with an example implementation of the present disclosure.

In FIG. 6, the example light-emitting structure 600 may include a substrate 602, a sub-pixel stack 614 over the substrate 602, and a cover window 616 over the sub-pixel stack 614. The sub-pixel stack 614 may include an emissive layer 608 between a first transport layer 606 (e.g., an HTL layer) and a second transport layer 610 (e.g., an ETL layer), a first electrode layer 604 (e.g., a bottom reflective anode) coupled to the first transport layer 606, and a second electrode layer 612 (e.g., a top transparent cathode) coupled to the second transport layer 610. The example light-emitting structure 600 may be a TE structure in one or more implementations of the present disclosure, but is not limited to the TE structure example provided herein. The arrangement of the first electrode layer 604 and the second electrode layer 612 is not limited to the examples provided herein and may be reversed. For example, the first electrode layer 604 may be a bottom cathode that is a metallic reflector that reflects light emitted from the emissive material 608, and the second electrode layer 612 may be a top anode that is non-metallic and substantially transparent.

The example light-emitting structure 600 in FIG. 6 may be substantially similar in structure with respect to the example light-emitting structure 500B in FIG. 5B. The example light-emitting structure 600 in FIG. 6 may differ from the example light-emitting structure 500B in FIG. 5B in that the example light-emitting structure 600 may include an interface 618 with an interface roughness introduced between the second electrode layer 612 and the cover window 616 facing away from the emissive layer 608. In other words, the interface 618 with the interface roughness may be outside the cavity of the example light-emitting structure 600. The scattered component introduced by the interface roughness may not be strongly color-detuned from the cavity component. Thus, a larger scattered component may be chosen to cancel the color shift due to the cavity component. In other words, the luminance ratio $L_{sc}/L_{cav}$ may need to be greater in value for scattering from outside the cavity compared to scattering from within the cavity. Moreover, the level of roughness (e.g., the roughness height) may need to be greater for a roughened interface outside the cavity compared to the level of roughness (e.g., the roughness height) inside the cavity. In some implementations, with a roughness introduced to a metallic interface 618 between the second electrode layer 612 and the cover window 616, a roughness power spectrum may be represented by the following mathematical Expression [3]:

$$(10nm)^2 < 2\pi \int_{0.1(2\pi/\lambda_c)}^{10(2\pi/\lambda_c)} k_{sp} dk_{sp} * S(k_{sp}) < (30nm)^2 \quad \text{Expression [3]}$$

where the roughness may be described by a roughness spectrum $S(k_{sp})$ expressed as a function of the spatial frequency $k_{sp}$, and $\lambda_c$ is a wavelength characteristic of the light emission (e.g. the peak wavelength).

FIG. 7 is a schematic cross-sectional view of another example light-emitting structure in accordance with an example implementation of the present disclosure.

In FIG. 7, the example light-emitting structure 700 may include a substrate 702, a sub-pixel stack 714 over the substrate 702, and a cover window 716 over the sub-pixel stack 714. The sub-pixel stack 714 may include an emissive layer 708 between a first transport layer 706 (e.g., an HTL layer) and a second transport layer 710 (e.g., an ETL layer), an intermediate layer 720 coupled to the first transport layer 706, a first electrode layer 704 (e.g., a bottom reflective anode) coupled to the intermediate layer 720, and a second electrode layer 712 (e.g., a top transparent cathode) coupled to the second transport layer 710. The example light-emitting structure 700 may be a TE structure in one or more implementations of the present disclosure, but is not limited to the TE structure example provided herein. The arrangement of the first electrode layer 704 and the second electrode layer 712 is not limited to the examples provided herein and may be reversed. For example, the first electrode layer 704 may be a bottom cathode that is a metallic reflector that reflects light emitted from the emissive material 708, and the second electrode layer 712 may be a top anode that is non-metallic and substantially transparent.

In one or more implementations of the present disclosure, the example light-emitting structure 700 in FIG. 7 may include an interface 718 with an interface roughness introduced between the intermediate layer 720 and the first transport layer 706 facing towards the emissive layer 708. In other words, the interface 718 with the interface roughness may be introduced within the cavity. In one or more implementations, to attain a particular height for the interface roughness of the interface 718 that may provide a scattering component with sufficient scattering power, a sizeable refractive index step (e.g., index difference) Δn between the intermediate layer 720 and the first transport layer 706 above the intermediate layer 720 may be desirable. The scattered power may depend on the refractive index step Δn according to $\Delta n^4$. In one or more implementations, the refractive index step Δn may be greater than 0.2. It may not be possible to use two first transport layers 706 (e.g., two layers of HTL materials) with such a sizeable refractive index step Δn. The refractive index step Δn may be formed between the intermediate layer 720 (e.g., a transparent conductive material layer) and the first transport layer 706 (e.g., an HTL layer). In one implementation, the transparent conductive intermediate layer 720 may have a thickness of 9-10 nm, but is not limited to the example thickness provided herein. In one implementation, the transparent conductive intermediate layer 720 may include conductive materials such as ITO having a relatively small refractive index step Δn with the HTL materials. In one implementation, the transparent intermediate layer 720 may include a composite, such as a host material layer having a low refractive index (e.g., air, etc.) and containing a high density of nano-particles including transparent conducting material (e.g., ITO, etc.) in the host material layer. The nano-particles may be considered sub-wavelength in size, thus effectively behaving as a transparent conductive layer that does not perform volume scattering. The materials of the transparent intermediate layer 720 are not limited to the examples provided herein.

FIG. 8 is a schematic cross-sectional view of another example light-emitting structure in accordance with an example implementation of the present disclosure.

In FIG. 8, the example light-emitting structure 800 may include a substrate 802, a sub-pixel stack 814 over the substrate 802, and a cover window 816 above the sub-pixel stack 814. The sub-pixel stack 814 may include an emissive layer 808 between a first transport layer 806 (e.g., an HTL layer) and a second transport layer 810 (e.g., an ETL layer), a first electrode layer 804 (e.g., a bottom reflective anode) coupled to the first transport layer 806, and a second electrode layer 812 (e.g., a top transparent cathode) coupled to the second transport layer 810. The example light-emitting structure 800 may be a TE structure in one or more implementations of the present disclosure, but is not limited to the TE structure example provided herein. The arrangement of the first electrode layer 804 and the second electrode layer 812 is not limited to the examples provided herein and may be reversed. For example, the first electrode layer 804 may be a bottom cathode that is a metallic reflector that reflects light emitted from the emissive material 808, and the second electrode layer 812 may be a top anode that is non-metallic and substantially transparent.

The example light-emitting structure 800 in FIG. 8 may be substantially similar to the example light-emitting structure 700 in FIG. 7. The example light-emitting structure 800 in FIG. 8 may differ from the example light-emitting structure 700 in FIG. 7 in that the example light-emitting structure 800 in FIG. 8 may include an intermediate layer 820 between the second electrode layer 812 and the cover window 816, and the intermediate layer 820 may include an interface 818 with an interface roughness introduced between the intermediate layer 820 and the cover window 816 facing away from the emissive layer 808. In other words, the interface 818 with the interface roughness may not be in contact with the second electrode layer 812 and may be outside the cavity. As such, a greater scattered field contribution (component) may be selected to substantially reduce the color shift with angle from the cavity contribution (component). A sizeable refractive index step 4n between the cover window 816 and the intermediate layer 820 may be desirable such that sufficient scattering power may be obtained with a certain roughness height. In one or more implementations, the refractive index step 4n is greater than 0.2. In one or more implementations, the intermediate layer 820 may include at least a pure dielectric material, such as Lithium Fluoride (LiF) or Silicon Monoxide (SiO). In other implementations, the intermediate layer 820 may include at least a transparent and conductive material, such as ITO. The materials of the intermediate layer 820 are not limited to the example materials provided herein.

FIG. 9A is a schematic cross-sectional view of another example light-emitting structure in accordance with an example implementation of the present disclosure. FIG. 9B is a schematic cross-sectional view of another example light-emitting structure in accordance with an example implementation of the present disclosure.

In FIG. 9A, the example light-emitting structure 900A may include a substrate 902, a sub-pixel stack 914 over the substrate 902, and a cover window 916 over the sub-pixel stack 914. The sub-pixel stack 914 may include an emissive layer 908 between a first transport layer 906 (e.g., an HTL layer) and a second transport layer 910 (e.g., an ETL layer), a first electrode layer 904 (e.g., a bottom reflective anode) coupled to the first transport layer 906, and a second electrode layer 912 (e.g., a top transparent cathode) coupled to the second transport layer 910. The example light-emitting structure 900A may be a TE structure in one or more implementations of the present disclosure, but is not limited to the TE structure example provided herein. The arrangement of the first electrode layer 904 and the second electrode layer 912 is not limited to the examples provided herein and may be reversed. For example, the first electrode layer 904 may be a bottom cathode that is a metallic reflector that reflects light emitted from the emissive material 908, and the second electrode layer 912 may be a top anode that is non-metallic and substantially transparent.

In one or more implementations of the present disclosure, the example light-emitting structure 900A in FIG. 9A may include an interface 918 with an interface roughness introduced between the second electrode layer 912 and the second transport layer 910 facing towards the emissive layer 908. In other words, the interface 918 with the interface roughness may be inside the cavity of the example light-emitting structure 900A. The example light-emitting structure 900A may be substantially similar in structure with respect to the example light-emitting structure 500B in FIG. 5B. The example light-emitting structure 900A in FIG. 9A may differ from the example light-emitting structure 500B in FIG. 5B in that the second electrode layer 912 of the example light-emitting structure 900A may include a non-metallic material, such as a transparent electrode, while the second electrode layer 512 of the example light-emitting structure 500B may include a metallic material.

In FIG. 9B, the example light-emitting structure 900B may include a substrate 902, a sub-pixel stack 914 over the substrate 902, and a cover window 916 over the sub-pixel stack 914. The sub-pixel stack 914 may include an emissive layer 908 between a first transport layer 906 (e.g., an HTL layer) and a second transport layer 910 (e.g., an ETL layer), a first electrode layer 904 (e.g., a bottom reflective electrode) coupled to the first transport layer 906, and a second electrode layer 912 (e.g., a top transparent electrode) coupled to the second transport layer 910. The example light-emitting structure 900B may be a TE structure in one or more implementations of the present disclosure, but is not limited to the TE structure example provided herein.

In one or more implementations of the present disclosure, the example light-emitting structure 900B in FIG. 9B may include an interface 918 with an interface roughness introduced between the second electrode layer 912 and the cover window 916 facing away from the emissive layer 908. In other words, the interface 918 with the interface roughness may be outside the cavity of the example light-emitting structure 900B.

The example light-emitting structure 900B in FIG. 9B may be substantially similar in structure with respect to the example light-emitting structure 600 in FIG. 6. The example light-emitting structure 900B in FIG. 9B may differ from the example light-emitting structure 600 in FIG. 6 in that the second electrode layer 912 of the example light-emitting structure 900B may include a non-metallic material, such as a transparent electrode, while the second electrode layer 612 of the example light-emitting structure 600 may include a metallic material.

In FIGS. 9A and 9B, the light-emitting structures 900A and 900B may include the roughened interface 918 on the "bottom" or the "top" of the transparent second electrode layer 912, respectively. Imperfect planarization during fabrication of the roughened interface 918 may cause other interfaces in the light-emitting structure to inherit some roughness. With the second electrode layer 912 including a transparent material rather than a metallic material, reflections at the interface 918 (unless a total internal refection condition is met) between the transparent second electrode layer 912 and the second transport layer 910 in the example light-emitting structure 900A are much weaker than reflections from the interface 518 between the metallic second electrode layer 512 and the second transport layer 510 in the example light-emitting structure 500B in FIG. 5B. As such, the cavity interference (e.g., an "etalon effect") from a cavity structure defined between two electrode layers (e.g., a transparent electrode and a metal electrode) may be significantly weakened and may lead to less spectral narrowing than may be possible, which may cause the accessible color gamut range to be lower than expected for a high-quality product in an OLED display application. In a QLED display, the QD emitters possess a narrower emission spectrum than an organic dye emitter within an OLED display. Hence, spectral narrowing may not be required for a QLED display, thus the cavity can be weaker. With a transparent "top" electrode layer (e.g., the second electrode layer 912 in FIGS. 9A and 9B), the cavity effect can be maximised if the transparent "top" electrode layer may include transparent conductive nanoparticles (e.g., ITO nanoparticles) within a low refractive index host material or air. A side effect of a weaker cavity and reduced spectral narrowing is that the scattered light may not be very color-detuned from the cavity component (or contribution). Thus, a greater scattered component (or contribution) may be chosen to cancel the color shift from the cavity component.

The present disclosure seeks to improve upon control of color shifts with varying angles in an emissive display by implementing weak scattering correction, which emphasizes on light scattering that is weak as opposed to strong scattering such that LEE of a light-emitting structure is minimally affected while color shifts with varying angles are reduced.

From the present disclosure, it can be seen that various techniques may be used for implementing the concepts described in the present disclosure without departing from the scope of those concepts. While the concepts have been described with specific reference to certain implementations, a person of ordinary skill in the art may recognize that changes may be made in form and detail without departing from the scope of those concepts. As such, the described implementations are to be considered in all respects as illustrative and not restrictive. It should also be understood that the present disclosure is not limited to the particular implementations described but rather many rearrangements, modifications, and substitutions are possible without departing from the scope of the present disclosure.

What is claimed is:
1. A light-emitting structure comprising:
   a substrate;
   a sub-pixel stack over the substrate and configured to emit light, the sub-pixel stack comprising:
      an emissive layer between a first transport layer and a second transport layer;

a first electrode layer coupled to the first transport layer; and a second electrode layer coupled to the second transport layer;

a cover layer over the sub-pixel stack; and at least one interface between the substrate and the cover layer, the at least one interface having an interface roughness, the emitted light comprising:

a scattering component caused by the interface roughness; and a cavity component separate from the scattering component, wherein:

a ratio of a luminance of the scattering component to a luminance of the cavity component increases with a viewing angle relative to a display normal; and an optical power of the scattering component is a fraction of an optical power of the cavity component.

2. The light-emitting structure of claim 1, wherein the at least one interface is between two adjacent layers of the sub-pixel stack.

3. The light-emitting structure of claim 1, wherein the interface roughness has a root mean square roughness between 5 nm and 30 nm over a plurality of spatial frequencies between 0.1 and 10 times the inverse of a central wavelength of light emitted from the sub-pixel stack.

4. The light-emitting structure of claim 3, wherein the optical power of the scattering component is more than 2% and less than 20% of the optical power of the cavity component.

5. The light-emitting structure of claim 3, wherein over a viewing angle from 0° to 60°, the ratio of the luminance of the scattering component to the luminance of the cavity component varies by at least a factor of 3.

6. The light-emitting structure of claim 3, wherein over a viewing angle from 0° to 60°, a color shift of the sub-pixel stack with the at least one interface is reduced by at least a factor of 1.5 in CIE 1976 color space to a color shift of the sub-pixel stack without the at least one interface.

7. The light-emitting structure of claim 3, wherein over a viewing angle from 0° to 60°, a color shift of a white-point formed from a superposition of light output from two or more sub-pixel stacks with the at least one interface is reduced by at least a factor of 1.5 in CIE 1976 color space compared to a color shift of the white point from the two or more sub-pixel stacks without the at least one interface.

8. The light-emitting structure of claim 2, wherein the at least one interface is between the first electrode layer and the first transport layer facing the emissive layer, and the first electrode layer is metallic.

9. The light-emitting structure of claim 2, wherein the at least one interface is between the second electrode layer and the second transport layer facing the emissive layer, and the second electrode layer is metallic.

10. The light-emitting structure of claim 1, wherein the at least one interface is between the second electrode layer and the cover layer facing away from the emissive layer.

11. The light-emitting structure of claim 2, further comprising:

an intermediate layer between the first electrode layer and the first transport layer, wherein the at least one interface is between the intermediate layer and the first transport layer and faces the emissive layer.

12. The light-emitting structure of claim 11, wherein the intermediate layer comprises a host material and a plurality of nanoparticles made of a transparent conductive material in the host material.

13. The light-emitting structure of claim 11, wherein a difference between a refractive index of the intermediate layer and a refractive index of the first transport layer is greater than 0.2.

14. The light-emitting structure of claim 1, further comprising:

an intermediate layer between the second electrode layer and the cover layer, wherein the at least one interface is between the intermediate layer and the cover layer and faces away from the emissive layer.

15. The light-emitting structure of claim 14, wherein the intermediate layer is a dielectric layer or a transparent and conductive layer.

16. The light-emitting structure of claim 14, wherein a difference between a refractive index of the intermediate layer and a refractive index of the cover layer is greater than 0.2.

17. The light-emitting structure of claim 2, wherein the at least one interface is between the second electrode layer and the second transport layer facing the emissive layer, and the second electrode layer is non-metallic.

18. The light-emitting structure of claim 1, wherein the at least one interface is between the second electrode layer and the cover layer facing away from the emissive layer, and the second electrode layer is non-metallic.

19. The light-emitting structure of claim 1, wherein:

the first transport layer includes a hole transport layer;

the second transport layer includes an electron transport layer;

the first electrode layer is an anode layer including a reflector for reflecting the light emitted from the emissive layer; and the second electrode layer is a cathode layer including a substantially transparent material.

20. The light-emitting structure of claim 1, wherein:

the first transport layer includes an electron transport layer;

the second transport layer includes a hole transport layer;

the first electrode layer is a cathode layer having a reflector for reflecting the light emitted from the emissive layer; and the second electrode layer is an anode layer having a substantially transparent material.

* * * * *